United States Patent
Hörberg et al.

(10) Patent No.: US 12,142,810 B2
(45) Date of Patent: Nov. 12, 2024

(54) COMPACT OSCILLATOR DEVICE WITH A CAVITY RESONATOR ON A CIRCUIT BOARD

(71) Applicant: Telefonaktiebolaget LM Ericsson (publ), Stockholm (SE)

(72) Inventors: Mikael Hörberg, Torslanda (SE); Jan Sandberg, Frillesås (SE); Daniel Sjöberg, Mölndal (SE); Niklas Lidström, Heidelberg (DE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 324 days.

(21) Appl. No.: 17/782,282

(22) PCT Filed: Dec. 16, 2019

(86) PCT No.: PCT/EP2019/085452
§ 371 (c)(1),
(2) Date: Jun. 3, 2022

(87) PCT Pub. No.: WO2021/121551
PCT Pub. Date: Jun. 24, 2021

(65) Prior Publication Data
US 2023/0009025 A1    Jan. 12, 2023

(51) Int. Cl.
*H03K 7/06*   (2006.01)
*H01P 7/06*   (2006.01)
(Continued)

(52) U.S. Cl.
CPC .............. *H01P 7/06* (2013.01); *H03B 5/1817* (2013.01); *H03B 5/187* (2013.01); *H05K 1/113* (2013.01);
(Continued)

(58) Field of Classification Search
CPC ........ H05K 1/113; H05K 1/181; H05K 1/115; H03B 5/187; H03B 5/1817; H03B 2200/0014; H01P 7/06
See application file for complete search history.

(56) References Cited

U.S. PATENT DOCUMENTS

2018/0183130 A1   6/2018  Bates
2018/0310399 A1  10/2018  Nair et al.
(Continued)

FOREIGN PATENT DOCUMENTS

EP         0766410 A2       4/1997
KR     20100006389 A        1/2010
(Continued)

OTHER PUBLICATIONS

Lidström, N., "A mechanically tunable cavity resonator for low-noise oscillators," Master's thesis in Wireless, Photonics and Space Engineering, 2019, pp. 1-76, Chalmers University of Technology, Department of Microtechnology and Nanoscience, Gothenburg, Sweden.
(Continued)

*Primary Examiner* — Quan Tra
*Assistant Examiner* — Ahn-Quan Tra
(74) *Attorney, Agent, or Firm* — COATS & BENNETT, PLLC

(57) ABSTRACT

The present disclosure relates to an oscillator device (1, 1', 1", 1''') comprising an active circuit device (2, 2'''), a circuit board (3) and a cavity resonator (4, 4'). The active circuit device (2, 2''') comprises an amplifier unit (5), and the circuit board (3) comprises a first main side (6) and a second main side (7), where the active circuit device (2, 2''') is mounted to the first main side (6). The cavity resonator (4, 4') is positioned on the second main side (7). The oscillator device (1) further comprises at least one excitation via connection
(Continued)

SECTION A-A (8) that runs through the circuit board (3) and electrically connects the active circuit device (2, 2''') to an excitation structure (9) inside the cavity resonator (4, 4').

19 Claims, 7 Drawing Sheets

(51) Int. Cl.
    *H03B 5/18*       (2006.01)
    *H05K 1/11*       (2006.01)
    *H05K 1/18*       (2006.01)

(52) U.S. Cl.
    CPC ............. *H05K 1/115* (2013.01); *H05K 1/181* (2013.01); *H03B 2200/0014* (2013.01)

(56) References Cited

U.S. PATENT DOCUMENTS

2019/0229391 A1    7/2019   Ligander et al.
2021/0234509 A1*  7/2021   Sandberg .................. H01P 7/06

FOREIGN PATENT DOCUMENTS

WO     WO-2016066227 A1 *  5/2016   ........... H03B 5/1215
WO        2019242859 A1    12/2019

OTHER PUBLICATIONS

Hörberg, M., "Low Phase Noise GaN HEMT Oscillator Design based on High-Q resonators," Thesis for the Degree of Doctor of Philosophy, Apr. 2017, pp. 1-95, Microwave Electronics Laboratory, Department of Microtechnology and Nanoscience MC2, Chalmers University of Technology, Gothenburg, Sweden.

* cited by examiner

SECTION A-A

SECTION B-B

SECTION A-A

COMPACT OSCILLATOR DEVICE WITH A CAVITY RESONATOR ON A CIRCUIT BOARD

TECHNICAL FIELD

The present disclosure relates to an oscillator device comprising an active circuit device with an amplifier unit, where the oscillator device further comprises a cavity resonator.

BACKGROUND

Oscillators are used for delivering a signal with a predetermined frequency, which may be adjustable. However, all oscillators that are set to a certain frequency tend to vary slightly around said frequency. This variation is known as phase noise.

In order to achieve low phase noise in an oscillator, it is well known that one of the main contributing parameters is the losses of the resonator, measured by its so-called Q factor, where a high Q means low losses and low phase noise. Especially for a Voltage Controlled Oscillator (VCO) where an electrical tuning element is coupled to the resonator, it is very difficult to acquire a low phase noise.

Millimeter-wave (mmW) beyond 100 GHz is becoming popular as telecommunication systems, vehicle radars and imaging sensors are to be made in frequencies of hundreds GHz, where demands on low phase noise for the frequency generation is increasing. The phase noise limitations in the oscillators are often the bottleneck for more complex modulation in a communication system and for the resolution and range in radar systems.

There exist a vast number of different technologies for realizing an oscillator. Basically, an oscillator is formed by an amplifier that is coupled to a resonator, where the resonator normally incorporates the tuning element.

A resonator can be built from microstrip or stripline structures on a substrate. It can also be built from discrete LC components, dielectric resonators, waveguide cavities or variants of these. The tuning element can be a varactor diode, ferroelectric material or some other variable reactance structure. The total Q of a resonator structure depends on the combined resistive losses of the respective components.

The difficulties to generate a high oscillation frequency leads to the usage of a fundamental oscillator at a lower frequency, which is multiplied several times to serve the desired frequency. Therefore, an increase in phase noise level is inevitably in the frequency multiplication. The remedy can be to use a very low phase noise oscillator with high performance at lower frequency realized as a metal cavity oscillator or as a dielectric resonator oscillator (DRO).

For tunability, the latter one is more difficult as most of the electromagnetic field are bounded internally in the dielectric and cannot easily be externally affected which is needed for tuning. Therefore, metal cavities are preferred, where a tuning mechanism can be placed inside the cavity, where examples of metal cavity oscillators are disclosed in for example WO 2016066227 and EP 2724415.

However, an implementation of a cavity oscillator requires large effort and the connection for the active device to the cavity can be bulky and unfriendly for volume production. There might be assembly difficulties due to the large size of the cavity compared to the small size of the active device implementation which normally is on packaged or bare die.

Furthermore, the coupling structure to the resonator for RF-excitation often entails a distance to the active device which is critical for the phase condition. This distance can limit the tuning bandwidth to fulfill the phase condition for optimal oscillation. The coupling impedance to the resonator is also critical, and sensitive for variations. The remedy is to use a minimum number of physical interfaces and a higher integration. Furthermore, tunability of the cavity are often today made by quite complex and bulky arrangements, e.g. by screws, trombones for phase adjusting.

There is thus a need for an enhanced oscillator device that comprises a cavity resonator, such as a metal cavity resonator or metalized cavity resonator, where the above drawbacks are alleviated.

SUMMARY

The object of the present disclosure is to provide an enhanced oscillator device that comprises an active circuit device with an amplifier unit, where the oscillator device further comprises a cavity resonator.

This object is achieved by means of an oscillator device comprising an active circuit device, a circuit board and a cavity resonator. The active circuit device comprises an amplifier unit, and the circuit board comprises a first main side and a second main side. The active circuit device is mounted to the first main side, and the cavity resonator is positioned on the second main side. The oscillator device further comprises at least one excitation via connection that runs through the circuit board and electrically connects the active circuit device to an excitation structure inside the cavity resonator.

In this way, a compact oscillator device is obtained where a cavity resonator is connected to an active circuit device by means of an integrated coupling structure. The distance between the passive part, the cavity resonator, and the active circuit device is kept low by efficient usage of via connections. This enables broad band tuning, avoiding impedance change and critical in-phase condition to be affected.

According to some aspects, the cavity resonator comprises electrically conducting inner walls.

This means that the cavity resonator has a relatively high Q factor which leads to low phase noise.

According to some aspects, the circuit board comprises a first main side metallization, a second main side metallization, and at least one dielectric layer positioned between the first main side metallization and the second main side metallization.

Such a circuit board can be consisted by any standard PCB (Printed Circuit Board) that enhances other integration possibilities besides the oscillator functionality needed for e.g. a radio board.

According to some aspects, the active circuit device is electrically connected to mounting pads comprised in the first main side metallization, where at least one mounting pad is connected to the excitation via connection. In this way, the distance between the passive part, the cavity resonator, and the active circuit device is kept at a minimum.

According to some aspects, a closing wall of the cavity resonator is comprised in a first metallization part on the second main side.

According to some aspects, the cavity resonator is formed by an electrically conducting first lid, and the closing wall, where the electrically conducting first lid comprises an opening that is facing the closing wall.

This means that the manufacture of the oscillator device is facilitated, as the attached cavity resonator has one open side. This simplifies die casting in the case of the cavity resonator being die-casted, and the open side is then closed by the first metallization part, that can be a standard ground plane, for easy assembling.

According to some aspects, the excitation structure comprises a second metallization part on the second main side, electrically separated from the first metallization part on the second main side. The first metallization part and the second metallization part are comprised in the second main side metallization.

In this way, the excitation structure is at least partially formed in the second main side metallization that can be a standard ground plane. This also means that the excitation structure is a PCB-compatible structure, integrated on a standard processed PCB with good tolerances for size and positioning.

According to some aspects, the first lid is adapted to cover at least a major part of the second main side.

In this way, the first lid can be integrated with other functions as duplex cavity filter, shielding or cooling structure, mechanical support etc.

According to some aspects, the metal lid comprises a circumferentially running protruding edge that surrounds the opening.

In this way, the edge will act as a metal gasket against the closing wall.

According to some aspects, the active circuit device comprises an active layer, where the active circuit device further comprises an internal via signal connection that connects the excitation via connection to the active layer.

In this way, the distance between the passive part, the cavity resonator, and the active circuit device is kept at a minimum According to some aspects, the oscillator device comprises a tuning element positioned within the cavity resonator.

According to some aspects, the tuning element is constituted by an electrically conducting body and a holding rod. The holding rod is attached to the electrically conducting body and is movable from the outside of the cavity resonator via openings in the cavity resonator such that the electrically conducting body can be moved between a plurality of positions within the cavity resonator by means of the holding rod.

In this way, the cavity resonator can easily be tuned for a coarse frequency setting, while the active part can contain a varactor or similar for fine tuning.

According to some aspects, the excitation structure comprises a sub-structure that protrudes into the cavity resonator.

Such an excitation structure can be formed in any suitable manner and be attached directly to the excitation via connection or to the second metallization part.

According to some aspects, the oscillator device comprises at least one ground via connection that runs through the circuit board and electrically connects the active circuit device to the first metallization part on the second main side.

According to some aspects, the circuit board is a multi-layer circuit board that comprises at least one intermediate metallization layer comprising at least one of a ground plane, a signal connections and power supply connections.

This enhances other integration possibilities besides the oscillator functionality needed, such as for example power supply and data signal transfer.

There are also disclosed herein methods associated with the above-mentioned advantages.

BRIEF DESCRIPTION OF THE DRAWINGS

The present disclosure will now be described more in detail with reference to the appended drawings, where.

DETAILED DESCRIPTION

Figure 1:
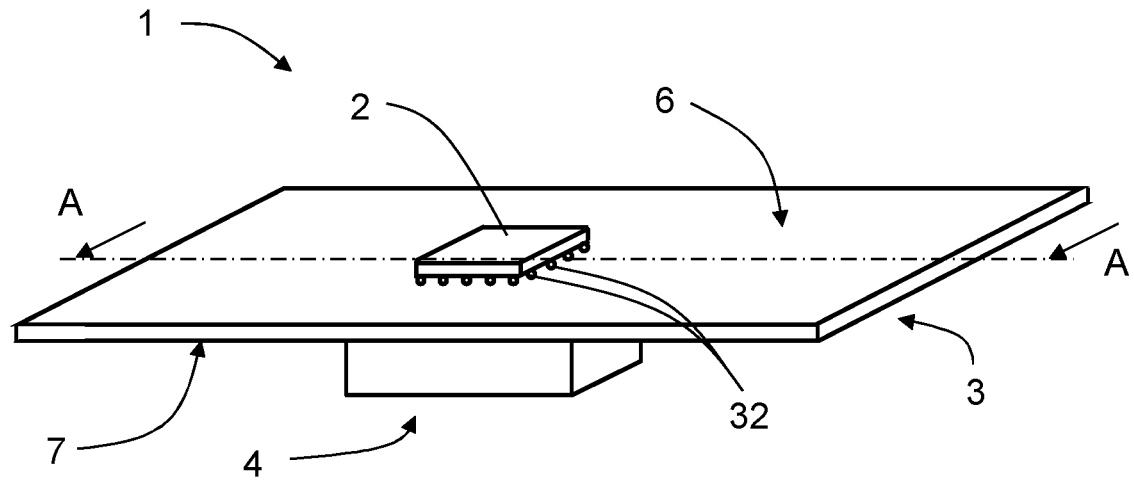
FIG. 1 schematically shows a perspective side view of an oscillator device according to the present disclosure.

Aspects of the present disclosure will now be described more fully hereinafter with reference to the accompanying drawings. The different devices, systems, computer programs and methods disclosed herein can, however, be realized in many different forms and should not be construed as being limited to the aspects set forth herein. Like numbers in the drawings refer to like elements throughout.

The terminology used herein is for describing aspects of the disclosure only and is not intended to limit the invention. As used herein, the singular forms "a", "an" and "the" are intended to include the plural forms as well, unless the context clearly indicates otherwise.

Figure 2:
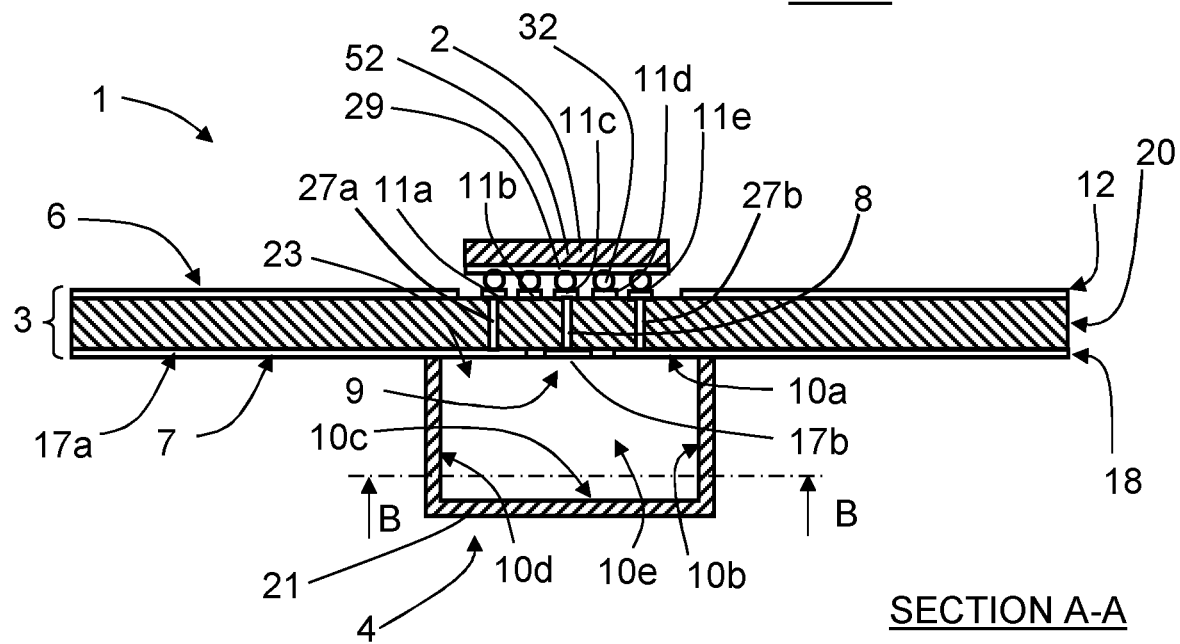
FIG. 2 schematically shows a section side view of the oscillator device according to FIG. 1.
Figure 9:
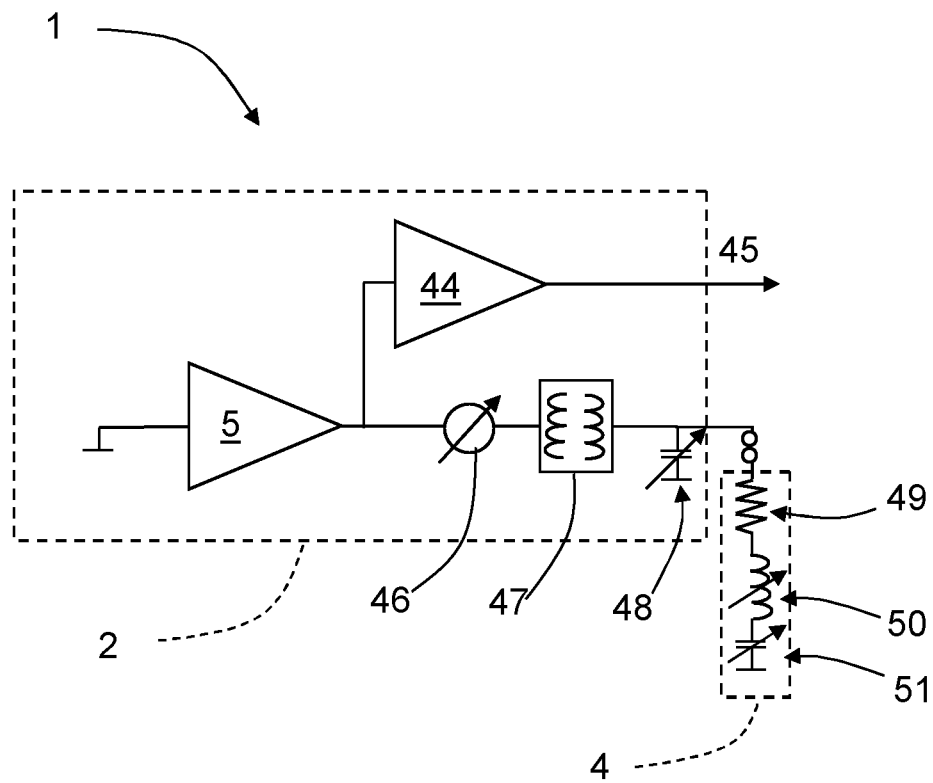
FIG. 9 schematically shows a simplified circuit layout for the oscillator device according to the present disclosure.

With reference to FIG. 1 that shows a side perspective view of an oscillator device and FIG. 2 that shows a section side view of FIG. 1, there is an oscillator device 1 comprising an active circuit device 2, a circuit board 3 and a cavity resonator 4, where the circuit board 3 comprises a first main side 6 and a second main side 7. With reference also to FIG. 9 that shows a simplified circuit layout for the oscillator device 1, the active circuit device 2 comprises a reflection amplifier unit 5, and is mounted to the first main side 7. The reflection amplifier unit 5 is preferable comprised in an active layer 29 comprised in the active circuit device 2, where the active layer 29 is positioned on a side of a circuit die 52 that faces the circuit board 3, the active circuit device 2 constituting a so-called flip-chip.

The reflection amplifier (series feedback) as shown in FIG. 9 is essential for the oscillator in this example to function, but generally it need not be a reflection amplifier. It can for example alternatively be a normal 2-port amplifier (parallel feedback) by using two coupling structures. This could be relevant for high frequencies if the cavity and thus coupling structures become smaller, so that the electrical length is still small with two coupling structures. Therefore, generally, the active circuit device 2 comprises an amplifier unit.

The circuit board 3 comprises a first main side metallization 12, a second main side metallization 18, and at least one dielectric layer 20 positioned between the first main side metallization 12 and the second main side metallization 18.

According to the present disclosure, the cavity resonator 4 is positioned on the second main side 7, where the oscillator device 1 further comprises an excitation via connection 8 that runs through the circuit board 3 and electrically connects the active circuit device 2 to an excitation structure 9, inside the cavity resonator 4.

In this example, according to some aspects, the second main side metallization 18 is positioned on the second main side 7 and comprises a first metallization part 17a and a second metallization part 17b. According to some aspects, the excitation structure 9 is constituted by the second metallization part 17b that is electrically separated from the first metallization part 17a. The excitation structure 9 is according to some aspects a coupling structure in the form of a patch antenna element, a slot antenna, or a microstrip line.

Furthermore, in this example, the first main side metallization 12 comprises solder pads 11a, 11b, 11c, 11d, 11e, where one or more solder pads 11c is connected to the excitation via connection 8. The active circuit device 2 is soldered to the solder pads 11a, 11b, 11c, 11d, 11e, and for this purpose the active circuit device 2 comprises solder connections 32 (only one or a few indicated in FIG. 1, FIG. 2 and FIG. 8 for reasons of clarity), such as for example a ball grid array (BGA).

The oscillator device 1 may optionally comprise at least one ground via connection, in this example two ground via connections 27a, 27b are shown. These ground via connections 27a, 27b run through the circuit board 3 and electrically connect the active circuit device 2 to the first metallization part 17a on the second main side 7. Assuming that the first metallization part 17a constitutes a ground plane, the ground via connections 27a, 27b connect the active circuit device 2 to electrical ground.

According to some aspects, the cavity resonator 4 is formed by an electrically conducting first lid 21 and a closing wall 10a that is comprised in the first metallization part 17a on the second main side 7. Furthermore, the electrically conducting first lid 21 is for example made in metal or in a metalized non-conducting material and comprises an opening 23 that is facing the closing wall 10a.

Figure 3:
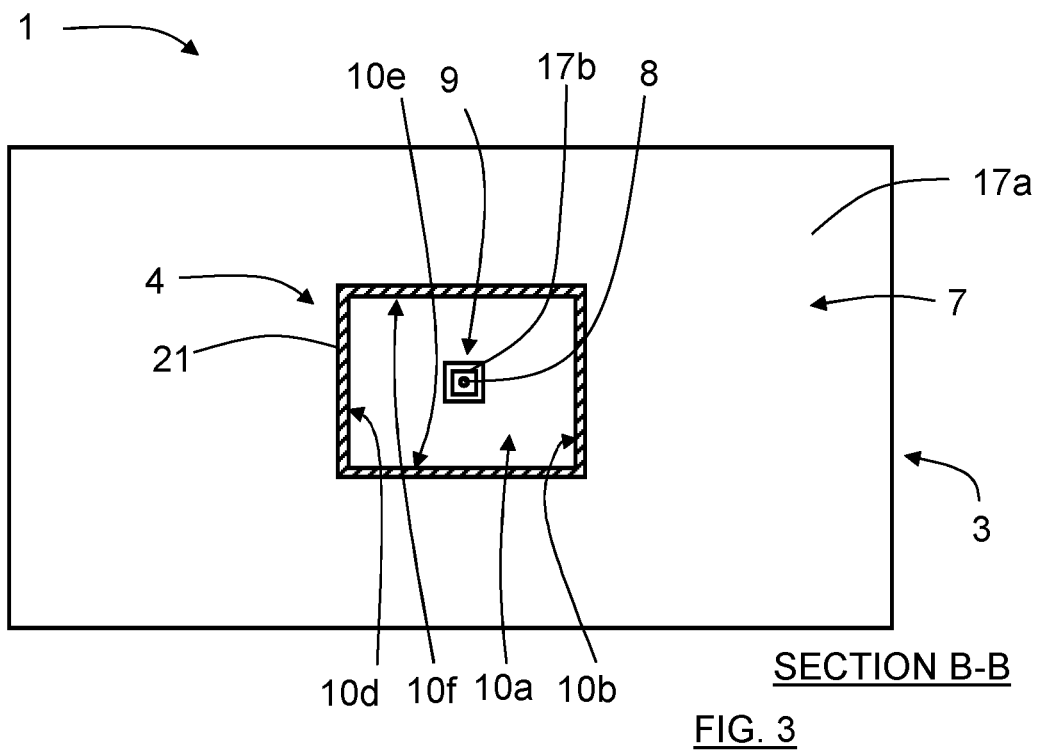
FIG. 3 schematically shows a section top view of the oscillator device according to FIG. 1 and FIG. 2.
Figure 4:
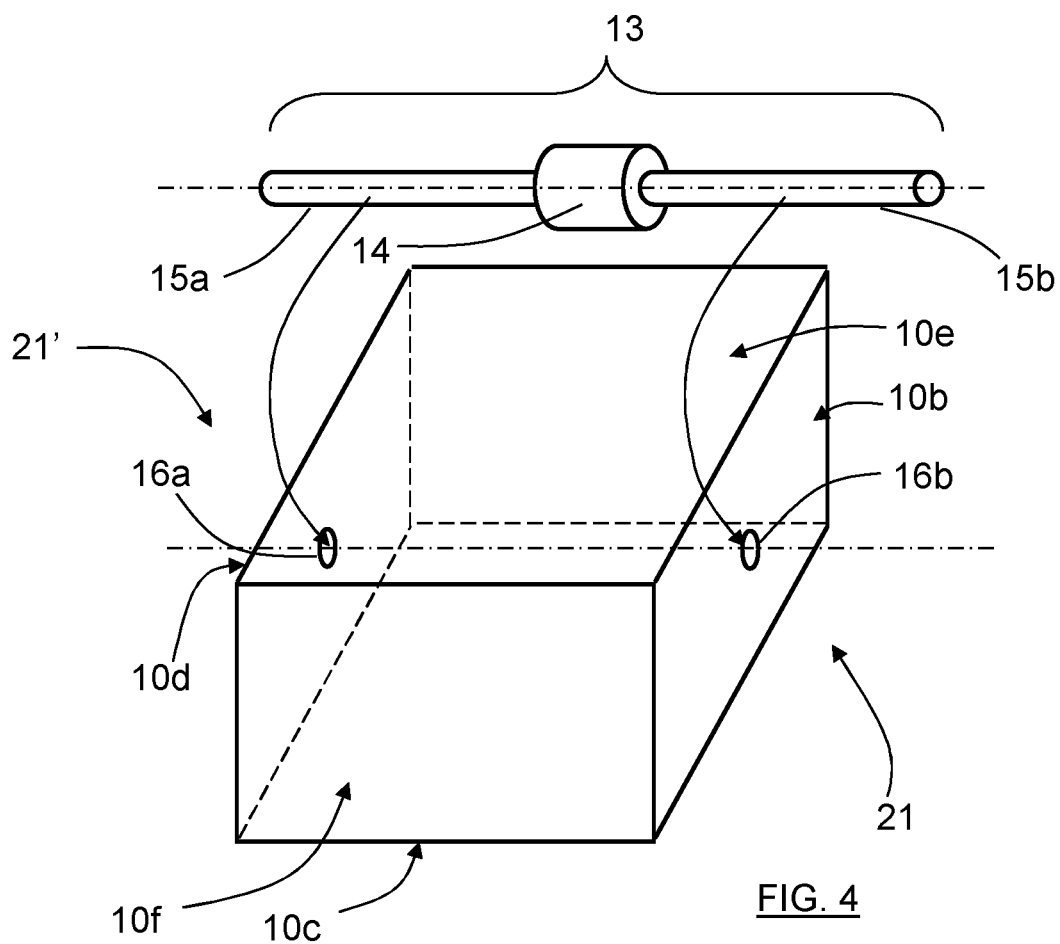
FIG. 4 schematically shows simplified perspective view of a tuning element to be positioned within the cavity resonator.
Figure 5:
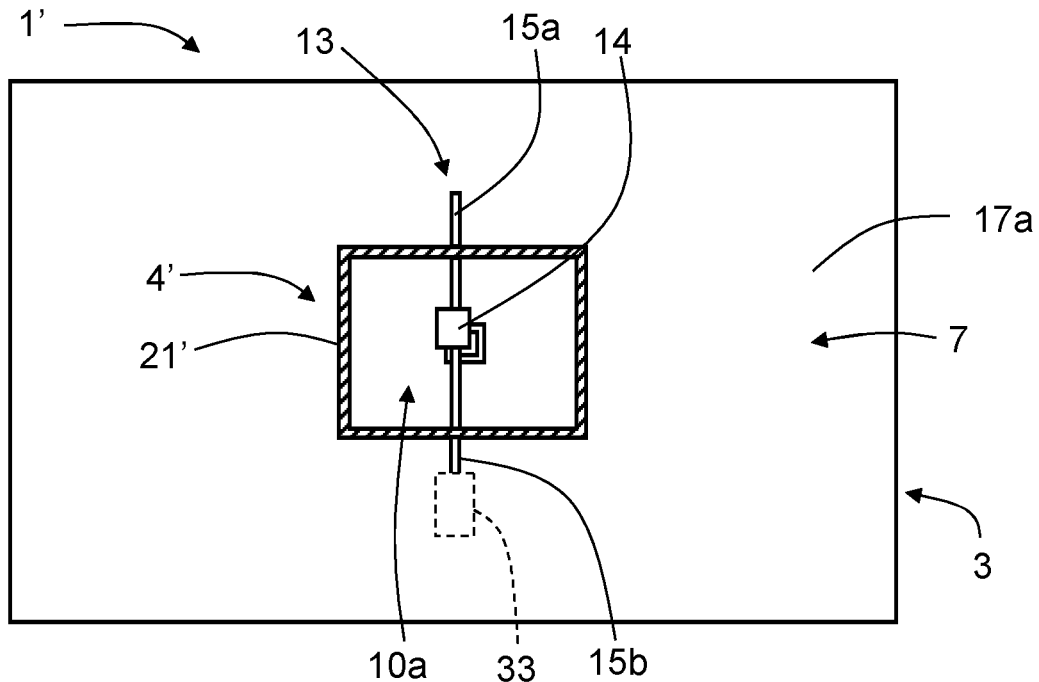
FIG. 5 corresponds to FIG. 3 with the tuning element mounted.

According to some further aspects, with reference to FIG. 4 that shows a simplified perspective view of the electrically conducting first lid 21' of the cavity resonator 4, and FIG. 5 that corresponds to FIG. 3, the oscillator device 1' comprises a tuning element 13 positioned within the cavity resonator 4'. The tuning element 13 is constituted by an electrically conducting body 14 and a holding rod 15a, 15b, where the holding rod 15a, 15b is attached to the electrically conducting body 14 and is movable from the outside of the cavity resonator 4' via openings 16a, 16b in the cavity resonator 4'. In this way, the electrically conducting body 14 can be moved between a plurality of positions within the cavity resonator 4' by means of the holding rod 15a, 15b.

According to some aspects, the holding rod 15a, 15b and the electrically conducting body 6 form the tuning element 13 as an integral electrically conducting part, alternatively the holding rod comprises two separate rod parts 15a, 15b that are attached to opposite sides of the electrically conducting body 14 or one rod that runs through the electrically conducting body 14. In the latter cases, the holding rod 15a, 15b can either be electrically conducting or not.

The holding rod 15a, 15b is extending through the cavity resonator 4' via the corresponding openings 16a, 16b, enabling the electrically conducting body 14 to be movable from the outside of the cavity resonator 4'. By moving the electrically conducting body 14 and thus displacing the electrically conducting body 14 within the cavity resonator 4', the cavity resonator 4' can be tuned with respect to its resonance frequency with a relatively high Q-value. The electrically conducting body 14 provides conductor loading and tuning the resonator over the frequency as it moves from the middle of the cavity, at the lowest frequency, towards the cavity wall, resulting in increasing frequency.

In order to displace the electrically conducting body 14 within the cavity resonator 4' in a controlled manner, according to some aspects, the openings 16a, 16b comprise threads (not shown) that engage corresponding threads (not shown) at the holding rod 15a, 15b. By means of the threads, angular rotation can be converted into a very precise linear movement of the electrically conducting body 14 inside the cavity resonator 4'.

As indicated in FIG. 5, according to some aspects, there is an electrically controllable motor 33, where the holding rod 15a, 15b is connected to the electrically controllable motor 33. In this way, it is possible to electrically control the position of the electrically conducting body 14 within the cavity resonator 4' and thus the resonance frequency of the cavity resonator 4' by means of electric control signal that are supplied to the motor 33.

Figure 6:
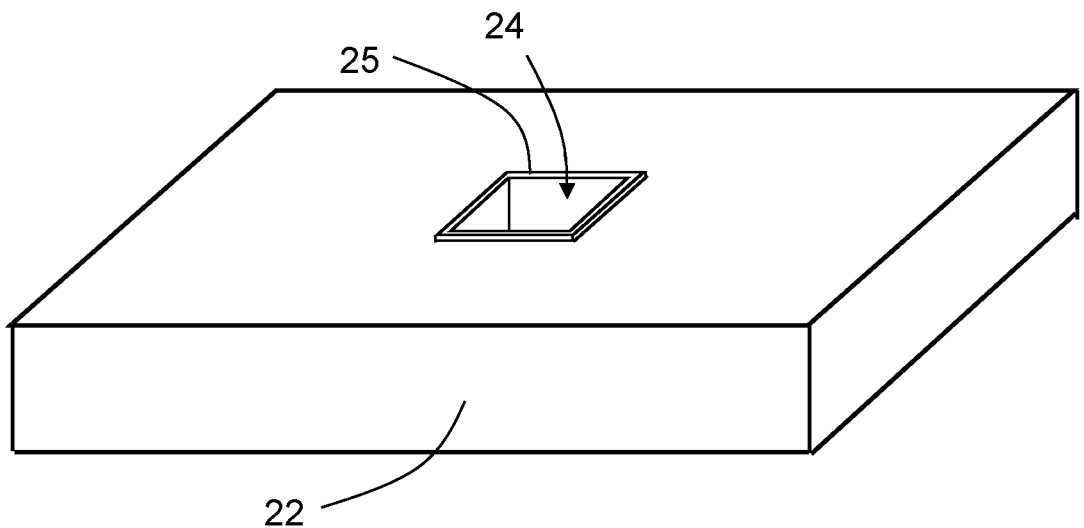
FIG. 6 schematically shows a first lid forming the cavity.
Figure 7:
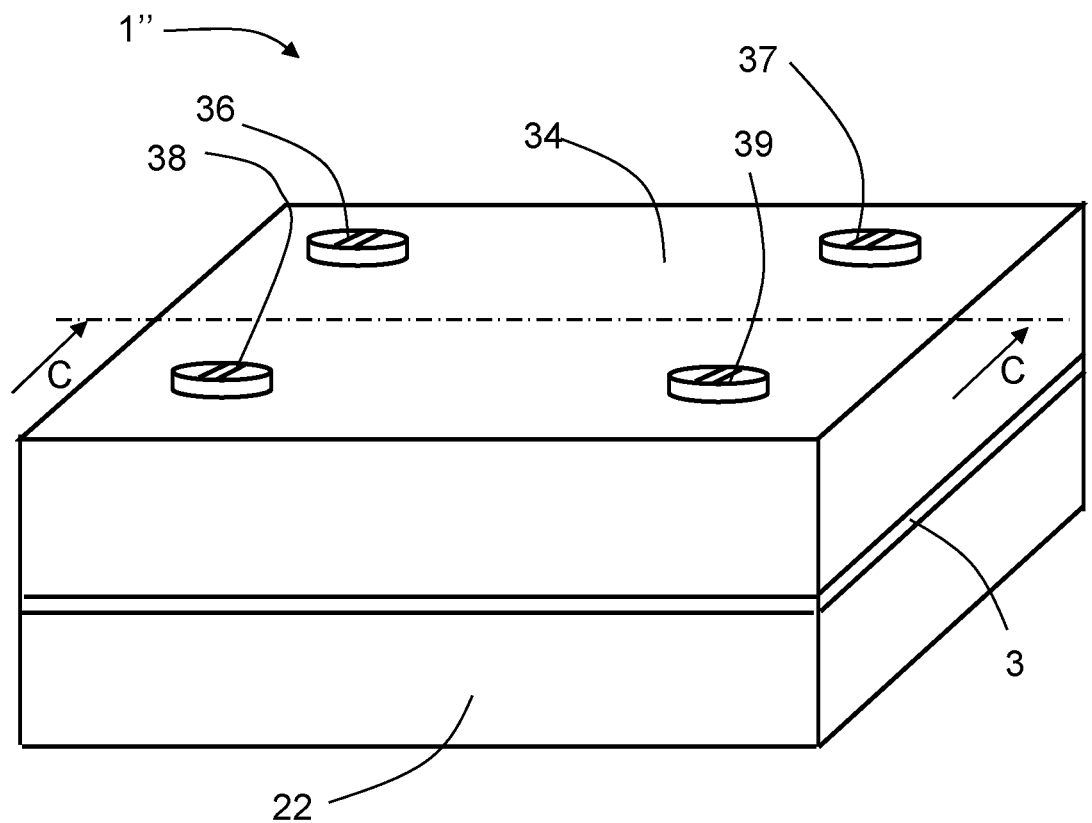
FIG. 7 schematically shows a perspective side view of an oscillator device with the bottom lid forming the cavity and with a second lid covering an active circuit device.
Figure 8:
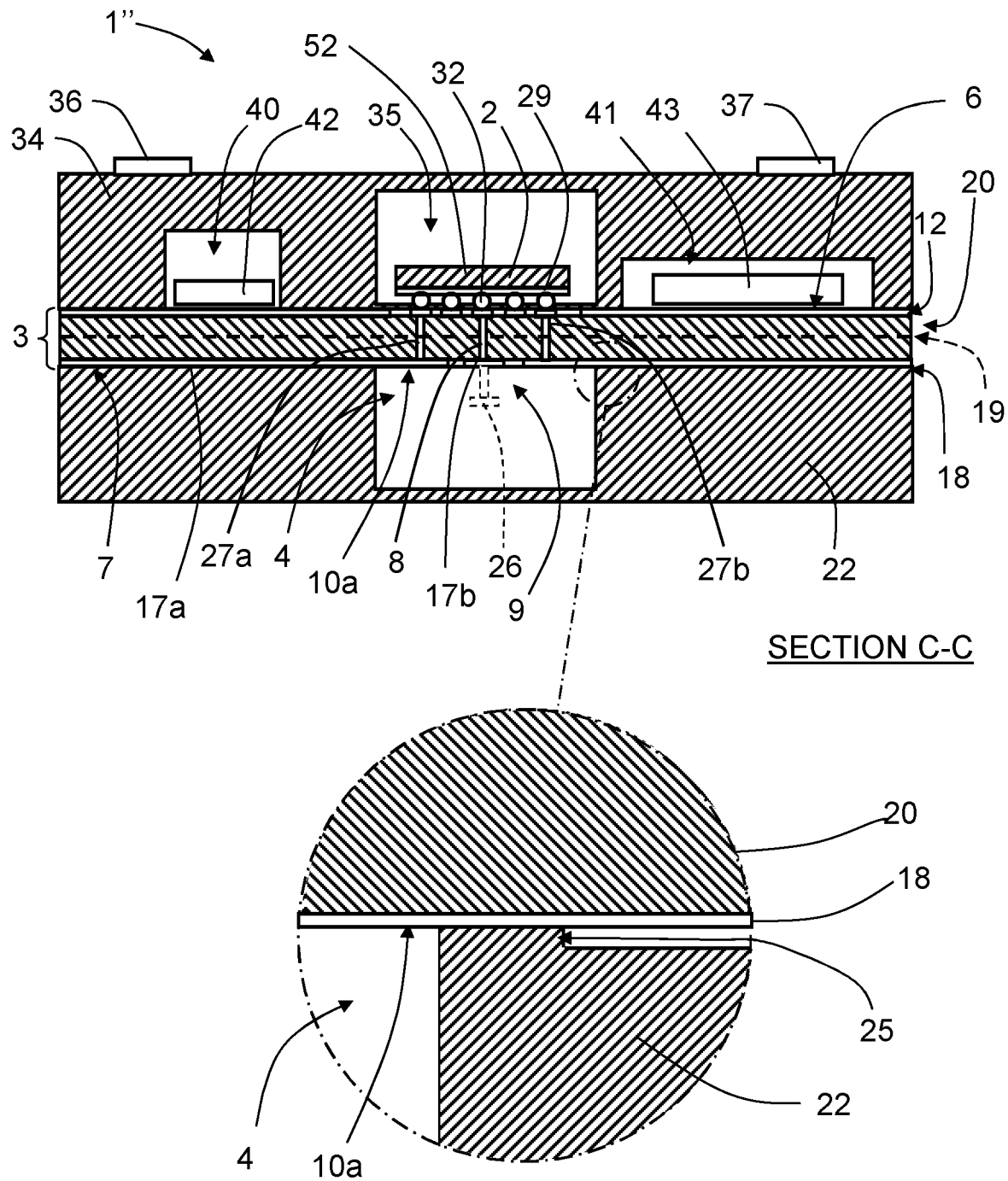
FIG. 8 schematically shows a section side view of the oscillator device according to FIG. 7.

According to some aspects, with reference to FIG. 6, FIG. 7 and FIG. 8, the oscillator device 1" comprises a first lid 22 that is adapted to cover at least a major part of the second main side 7. This means that the first lid 22 is formed from a piece of metal, or a piece of metalized non-conducting material, where an aperture is provided, having an opening and forming the cavity resonator 4' except for the closing wall 10a. According to some further aspects, especially with reference to FIG. 7 and FIG. 8, that is a side section view of FIG. 7, the oscillator device 1" comprises a second lid 34 that is adapted to cover the active circuit device 2, and to accomplish this, the second lid 34 comprises a first circuit cavity 35 that is adapted to accommodate the active circuit device 2.

The circuit board 3 is then sandwiched between the first lid 22 and the second lid 34, where the second lid 34 for example is made in metal or in a metalized non-conducting material. The first lid 22, the second lid 34 and the circuit board 3 are attached to each other by means of screws 36, 37, 38, 39 that run through the second lid 34 and the circuit board 3 and into first lid 22 where threads (not shown) are engaged. The screws can of course run from the first lid 22 and into the second lid 34 instead, and there can be any suitable number and sizes of screws. Other tightening or attachment means are also conceivable, for example the first lid 22 and the second lid 24 can be glued or soldered to the circuit board 3.

It is conceivable that there only is the first lid 22, not the second lid 34, where the first lid 22 then is attached to the circuit board 3 by means of screws, glue, solder or by means of some other tightening or attachment means.

In order to provide a suitable electrical sealing for the closing wall 10a against the first lid 22, there is a circumferentially running protruding edge 25 that surrounds the opening 24. This means that this edge 25 will act as a metal gasket against the closing wall 10a when the screws 36, 37, 38, 39 are tightened. This is in particular indicated in the enlarged circular part of FIG. 8.

According to some aspects, as indicated in FIG. 8, the second lid 34 comprises further circuit cavities 40, 41 that are adapted to accommodate further circuit devices 42, 43 that are mounted to the circuit board 3. In this manner, the second lid 34 provides electrical sealing between the circuit devices 2, 42, 43 that are mounted to the circuit board 3, preventing mutual RF (Radio Frequency) interference between the circuit devices 2, 42, 43. The second lid can also be used for the examples described with reference to FIGS. 1-5.

The second lid 34 is thus an optional feature that can provide mechanical support or shielding of other surrounding components. It may also have an advantage of improving the pressure to the bottom plate, as well as minimizing RF leakage from the cavity resonator 4.

As indicated with dashed lines in FIG. 8, the excitation structure 9 comprises a sub-structure 26 that protrudes into the cavity resonator 4. Such a protruding sub-structure 26 can be designed on many ways, the idea is to provide a suitable radiating structure.

Generally, the excitation structure 9 can be constituted by any one of:
A protruding part 26.
A protruding part 26 together with the second metallization part 17b.
The second metallization part 17b only.
An internal multilayer excitation structure.

For the first alternative, there can be a small second metallization part 17b that in practice does not form part of the excitation structure 9, but is covered by the protruding part 26, only forming an attachment surface for the protruding part 26. It is also possible that there, at least practically, is no second metallization part 17b at all, only the excitation via connection 8 that is directly connected to the protruding part 26, where the protruding part 26 then is soldered to the excitation via connection 8 and/or inserted into the excitation via connection 8. It is also conceivable that the protruding part 26 is formed by the excitation via connection 8 that continues past the circuit board 3 into the cavity resonator 4.

FIG. 9 schematically shows a simplified circuit layout for the oscillator device 1 that comprises the active circuit device 2 and the cavity resonator 4. The active circuit device 2 comprises the reflection amplifier unit 5 and a buffer amplifier unit 44 that is connected to an output port 45 to output a signal for low pulling sensitiveness. The reflection amplifier unit 5 is further connected to the cavity resonator 4 via a phase shifter 46 to fulfill the in-phase condition to the resonator, a coupling transformer 47 for optimizing the coupling factor to the resonator, and a grounded adjustable varactor 48 for fine-tuning the frequency for locking to a PLL (Phase-Locked Loop) (not shown). The cavity resonator 4 is represented by a series coupling of a resistor 49, an inductor 50 and a capacitor 51, where, for the case of a tunable cavity resonator 4, the inductance 50 and the capacitor 51 are indicated as being adjustable. The components of the active circuit device 2 are according to some aspects comprised in an active layer as shown in FIG. 2 and in FIG. 10, which will be discussed below.

It should be noted that FIG. 9 only illustrates a very simplified example, other realizations and representations are of course possible. For example, other integrated parts on die level can be a added such as a frequency prescaler for simpler connection to a PLL. A PLL and further a multiplier for frequency up-conversion can also be integrated on the die.

Figure 10:
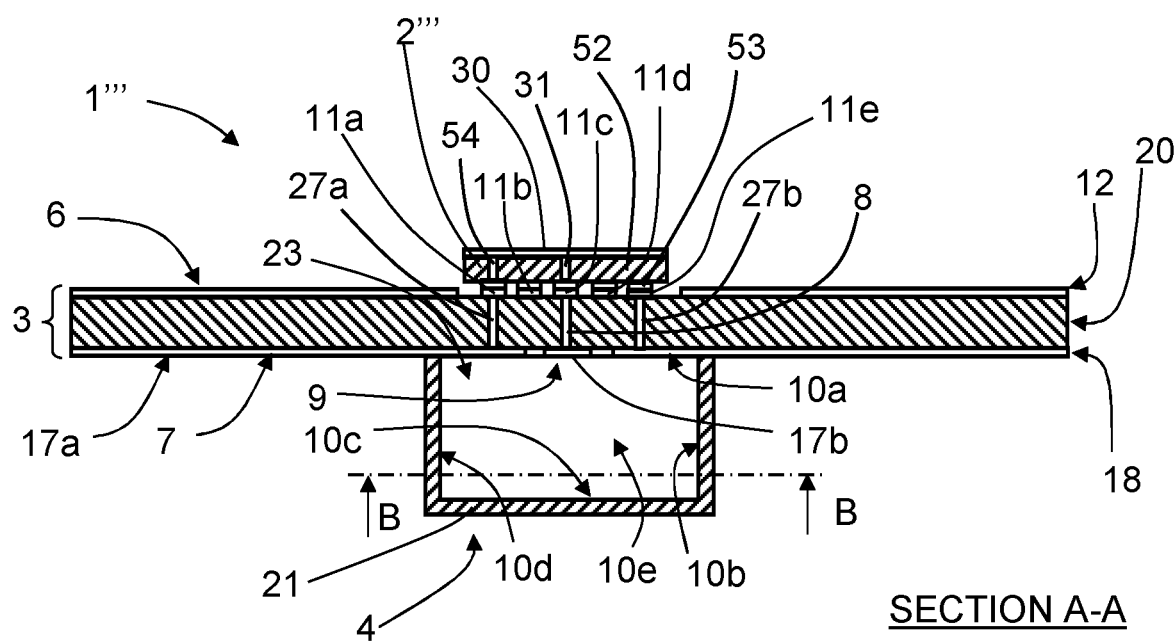
FIG. 10 corresponds to FIG. 2 where the active circuit device comprises an internal via connection.

In FIG. 2 and FIG. 8, the active circuit device 2 comprises its active layer 29 on a side of a circuit die 52 that faces the circuit board 3, constituting a so-called flip-chip. In FIG. 10, which corresponds to FIG. 2, the active circuit device 2''' further comprises an active layer 30 on a side of a circuit die 52 that faces away from the circuit board 3. In this case, the active circuit device 2''' further comprises an internal via signal connection 31 that connects the excitation via connection 8 to the active layer 30. An internal via ground connection 54 is also illustrated, providing a ground connection for the active layer 30. FIG. 10 also illustrates flat solder connections 53 (only one indicated for reasons of clarity) that constitute an alternative to the previously mentioned BGA connections. According to some aspects, ball and bump solder connections are also conceivable just as in the flip-chip case.

Figure 11:
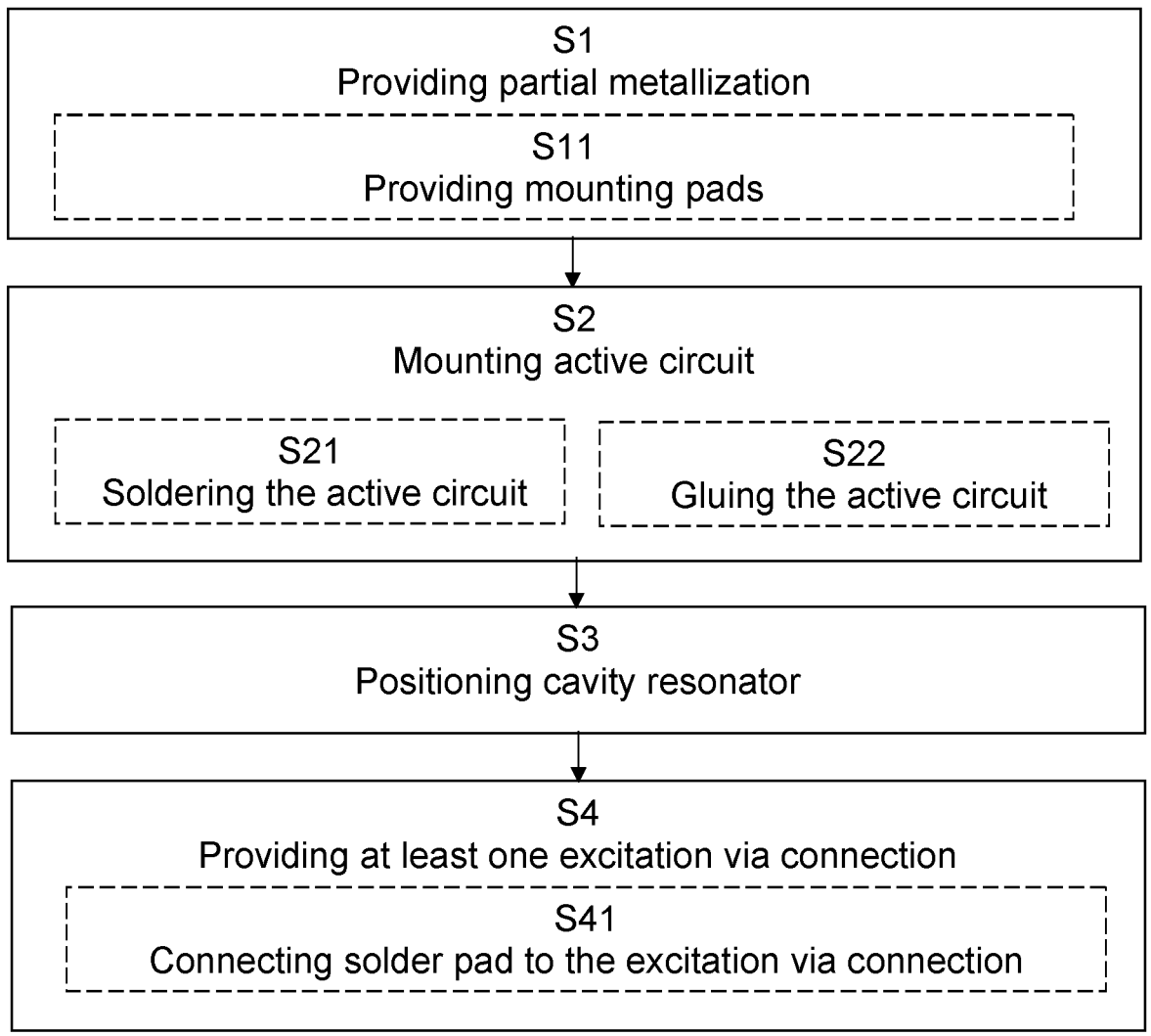
FIG. 11 shows a flowchart of methods according to embodiments.

With reference to FIG. 11, the present disclosure also relates to a method of configuring an oscillator device 1 comprising an active circuit device 2, a circuit board 3 and a cavity resonator 4, where the active circuit device 2 comprises a reflection amplifier unit 5 and the circuit board 3 comprises a first main side 6 and a second main side 7. The method comprises providing S1 a partial metallization on each main side 6, 7, and mounting S2 the active circuit device 2 to the first main side 6. The method further comprises positioning S3 the cavity resonator 4 on the second main side 7, and providing S4 at least one excitation via connection 8 that runs through the circuit board 3 and electrically connects the active circuit device 2 to an excitation structure 9 inside the cavity resonator 4.

The method can be carried out in any desired order, for example the cavity resonator can be positioned on the second main side 7 before the active circuit device 2 is mounted.

According to some aspects, providing S1 a partial metallization comprises providing (S11) mounting pads 11a, 11b, 11c, 11d, 11e, in a first main side metallization 12.

According to some aspects, mounting S2 the active circuit device 2 comprises one of soldering S21 mounting connectors 32, 53 used in the active circuit device 2 to the mounting pads 11a, 11b, 11c, 11d, 11e, or gluing S22 mounting connectors 32, 53 used in the active circuit device 2 to the mounting pads 11a, 11b, 11c, 11d, 11e.

According to some aspects, providing S4 at least one excitation via connection 8 comprises connecting S41 at least one mounting pad 11c to the excitation via connection 8.

The present disclosure provides a compact building practice of a cavity resonator 4 connected to a circuit board 3. The circuit board 3 forms one wall or a piece of a wall of the cavity resonator 4, and has an integrated coupling structure which is connected by through on or more excitation via connections to the opposite side, where the active part of the oscillator device 1 is mounted. The excitation via connection 8 can achieve a minimum distance which is required to not affect the in-phasing condition needed for broadband tuning. The active part can contain internal vias on the die 52 to connect the active side 30 of the active circuit device 2 to the side used for mounting, or it can be flip-chip connected to one or more excitation via connections 8.

Further, the cavity resonator 4 can be manufactured together with other mechanics, as for supporting the circuit board for electromagnetic shielding and cooling, or other radio functions as mechanical cavity duplex filter etc.

The present disclosure provides:

A very compact building practice to couple a high Q cavity resonator 4 for enhancing low phase noise, to a circuit board 4 with an integrated coupling structure and a mounted active circuit device 2.

A minimized distance between the passive part, the cavity resonator 4, and the active circuit device 2, by efficient usage of one or more via connections. This is a necessity for broad band tuning and to not affect the critical in-phase condition or cause impedance change. This is needed for optimal oscillation operation.

Easy manufacture, for example when the attached cavity resonator 4 comprises a bottom side lid 21, 22 with an opening 23, that simplifies die casting, and the side is then closed by a ground plane in a closing wall 10*a* for easy assembling.

A coupling structure 9 that can be a circuit board compatible structure, implemented as patch/slot antenna or microstrip line, integrated on a standard processed circuit board with good tolerances for size and positioning.

A circuit board that enhances other integration possibilities besides the oscillator functionality needed for e.g. a radio board.

A cavity resonator that can easily adapted to be tuned for a coarse frequency setting, while the active circuit device 2 contains the varactor 48 for fine tuning.

Integration of cavity mechanics with other functions as duplex cavity filter, shielding or cooling structure, mechanical support etc.

The present disclosure is not limited to the above, but may vary freely within the scope of the appended claims. For example, the cavity resonator 4 comprises electrically conducting inner walls 10*a*, 10*b*, 10*c*, 10*d*, 10*e*, 10*f*, and can for example be die-casted in a metal such as aluminum or in metalized plastic.

The solder pads are generally constituted by mounting pads 11*a*, 11*b*, 11*c*, 11*d*, 11*e*, where the active circuit device 2 comprises mounting connections 32, 53 which are electrically connected to mounting pads 11*a*, 11*b*, 11*c*, 11*d*, 11*e*, comprised in the first main side metallization 12. At least one mounting pad 11*c* is connected to the excitation via connection 8. The electrical connection is for example either made by means of soldering or by means of gluing. Gluing is normally used for low/medium power dissipation. Thermal eutectic compression for mounting when flip-chip mounting with cupper pillows or with stud bumps All examples are applicable for all realizations of the cavity resonator; either in the form of smaller first lid as shown in FIG. 1-FIG. 5 and FIG. 10, or a larger first lid 22 that is adapted to cover at least a major part of the second main side 7, as shown in FIG. 6-FIG. 8. For example, for a first lid 22 that is adapted to cover at least a major part of the second main side 7, a tuning element 13 can be formed as an embedded electrically controlled component, and/or having at least one holding rod 15*a*, 15*b* that extends outside the first lid 22.

The active circuit device 2 can comprise one or more active layers 29, 30, on one side, or on both sides, of active circuit device 2. It is also conceivable that the active circuit device 2 comprises one or more embedded active layers.

According to some aspects, the active circuit device 2 is in the form of an MMIC (Monolithic Microwave Integrated Circuit), where the building blocks described previously with reference to FIG. 9 are very suitable for integration on an MMIC. The metal layers on an MIMIC can be fabricated in a backend process where several metal layers can be stacked on the topside with e.g. thin BCB (benzocyclobutene) dielectric material in between. In this case, there is normally no internal via signal connections 31 running through the whole bare die 52, and a flip-chip mounting is a good alternative to connect the die, as bond wires are to be avoided. On the other hand, internal via ground connections 54 can be provided running through the whole bare die 52. This is used for high frequency processes, where the thickness of the bare die is comparable with the wavelength, or when you don't have a low loss substrate in the MMIC, e.g. in Si-processes.

In a medium frequency process, the chip substrate itself is used, and backside metallization is on the bottom side. Here both internal via signal connections 31 and internal via ground connections 54 can be used, running through the whole bare die 52. Both flip chip mounting or normal mounting can be used.

According to some aspects, as indicated in FIG. 8, the circuit board 3 is a multi-layer circuit board that comprises at least one intermediate metallization layer 19 comprising at least one of signal connections for data signals and power supply connections for supplying power to active components and/or ground planes. An intermediate layer 19 is generally connected to other metal layer by means of one or more via connections.

Other tuning mechanism in the cavity resonator 4 can be screws, or Microelectromechanical systems (MEMS) switches that are used for changing the electrical size of the cavity resonator 4.

The circuit board 3 can be any type of PCB (Printed Circuit Board) and can according to some aspects comprise any suitable dielectric carrier materials in one or more layers and corresponding metallization layers.

Generally, the present disclosure relates to an oscillator device 1, 1', 1", 1'" comprising an active circuit device 2, a circuit board 3 and a cavity resonator 4, 4'. The active circuit device 2 comprises an amplifier unit 5, and the circuit board 3 comprises a first main side 6 and a second main side 7. The active circuit device 2 is mounted to the first main side 6, and the cavity resonator 4, 4' is positioned on the second main side 7. The oscillator device 1 further comprises at least one excitation via connection 8 that runs through the circuit board 3 and electrically connects the active circuit device 2 to an excitation structure 9 inside the cavity resonator 4.

According to some aspects, the cavity resonator 4, 4' comprises electrically conducting inner walls 10*a*, 10*b*, 10*c*, 10*d*, 10*e*, 10*f*.

According to some aspects, the circuit board 3 comprises a first main side metallization 12, a second main side metallization 18, and at least one dielectric layer 20 positioned between the first main side metallization 12 and the second main side metallization 18.

According to some aspects, the active circuit device 2 is electrically connected to mounting pads 11*a*, 11*b*, 11*c*, 11*d*, 11*e*, comprised in the first main side metallization 12, where at least one mounting pad 11*c* is connected to the excitation via connection 8.

According to some aspects, a closing wall 10*a* of the cavity resonator is comprised in a first metallization part 17*a* on the second main side 7.

According to some aspects, the excitation structure 9 comprises a second metallization part 17*b* on the second main side 7, electrically separated from the first metallization part 17*a* on the second main side 7, where the first metallization part 17*a* and the second metallization part 17*b* are comprised in the second main side metallization 18.

According to some aspects, the cavity resonator 4, 4' is formed by an electrically conducting first lid 21, 21'; 22, and the closing wall 10a, where the electrically conducting first lid 21, 21'; 22 comprises an opening 23, 24 that is facing the closing wall 10a.

According to some aspects, the first lid 22 is adapted to cover at least a major part of the second main side 7.

According to some aspects, the metal lid 22 comprises a circumferentially running protruding edge 25 that surrounds the opening 24.

According to some aspects, the active circuit device 2''' comprises an active layer 30, where the active circuit device 2''' further comprises an internal via signal connection 31 that connects the excitation via connection 8 to the active layer 30.

According to some aspects, the oscillator device 1' comprises a tuning element 13 positioned within the cavity resonator 4'.

According to some aspects, the tuning element 13 is constituted by an electrically conducting body 14 and a holding rod 15a, 15b, where the holding rod 15a, 15b is attached to the electrically conducting body 14 and is movable from the outside of the cavity resonator 4' via openings 16a, 16b in the cavity resonator 4' such that the electrically conducting body 14 can be moved between a plurality of positions within the cavity resonator 4' by means of the holding rod 15a, 15b.

According to some aspects, the excitation structure 9 comprises a sub-structure 26 that protrudes into the cavity resonator 4.

According to some aspects, the oscillator device 1 comprises at least one ground via connection 27a, 27b that runs through the circuit board 3 and electrically connects the active circuit device 2 to the first metallization part 17 on the second main side 7.

According to some aspects, the circuit board 3 is a multi-layer circuit board that comprises at least one intermediate metallization layer 19 comprising at least one of a ground plane, a signal connections and power supply connections.

The invention claimed is:

1. An oscillator device comprising:
   a circuit board comprising a first main side and a second main side;
   an active circuit device mounted to the first main side of the circuit board, the active circuit device comprising an amplifier unit;
   a cavity resonator positioned on the second main side of the circuit board; and
   at least one excitation via a first connection that runs through the circuit board and electrically connects the active circuit device to an excitation structure inside the cavity resonator.

2. The oscillator device of claim 1, wherein the cavity resonator comprises electrically conducting inner walls.

3. The oscillator device of claim 1, wherein the circuit board comprises a first main side metallization, a second main side metallization, and at least one dielectric layer positioned between the first main side metallization and the second main side metallization.

4. The oscillator device of claim 3, wherein the active circuit device is electrically connected to a set of mounting pads comprised in the first main side metallization, where at least one mounting pad of the set is connected to the excitation via the first connection.

5. The oscillator device of claim 3, wherein a closing wall of the cavity resonator is comprised in a first metallization part on the second main side.

6. The oscillator device of claim 5, wherein the excitation structure comprises a second metallization part on the second main side, electrically separated from the first metallization part on the second main side, where the first metallization part and the second metallization part are comprised in the second main side metallization.

7. The oscillator device of claim 5, wherein the cavity resonator is formed by an electrically conducting first lid, and the closing wall, where the electrically conducting first lid comprises an opening that is facing the closing wall.

8. The oscillator device of claim 7, wherein the first lid is adapted to cover at least a major part of the second main side.

9. The oscillator device of claim 7, wherein the metal lid comprises a circumferentially running protruding edge that surrounds the opening.

10. The oscillator device of claim 1, wherein the active circuit device comprises an active layer, where the active circuit device further comprises an internal via signal connection that connects the excitation via connection to the active layer.

11. The oscillator device of claim 1, wherein the oscillator device comprises a tuning element positioned within the cavity resonator.

12. The oscillator device of claim 11, wherein the tuning element is constituted by an electrically conducting body and a holding rod, where the holding rod is attached to the electrically conducting body and is movable from the outside of the cavity resonator via openings in the cavity resonator such that the electrically conducting body can be moved between a plurality of positions within the cavity resonator by means of the holding rod.

13. The oscillator device of claim 1, wherein the excitation structure comprises a sub-structure that protrudes into the cavity resonator.

14. The oscillator device of claim 1, wherein the oscillator device comprises at least one ground via a second connection that runs through the circuit board and electrically connects the active circuit device to the first metallization part on the second main side.

15. The oscillator device of claim 1, wherein the circuit board is a multi-layer circuit board that comprises at least one intermediate metallization layer comprising at least one of a ground plane, a signal connection and a power supply connection.

16. A method of configuring an oscillator device comprising an active circuit device, a circuit board and a cavity resonator, where the active circuit device comprises an amplifier unit and the circuit board comprises a first main side and a second main side, where the method comprises:
   providing a partial metallization on the first main side and the second main side; and
   mounting the active circuit device to the first main side;
   positioning the cavity resonator on the second main side; and
   providing at least one excitation via connection that runs through the circuit board and electrically connects the active circuit device to an excitation structure inside the cavity resonator.

17. The method of claim 16, wherein providing a partial metallization comprises:
   providing a set of mounting pads in a first main side metallization.

18. The method of claim 17, wherein mounting the active circuit device comprises one of:
  soldering mounting connectors used in the active circuit device to the set of mounting pads; or
  gluing mounting connectors used in the active circuit device to the set of mounting pads.

19. The method of claim 16, wherein providing at least one excitation via connection comprises connecting at least one mounting pad of the set of mounting pads to the excitation via the connection.

* * * * *